United States Patent
Jue et al.

(10) Patent No.: US 10,635,628 B2
(45) Date of Patent: Apr. 28, 2020

(54) HOST CONTROLLER APPARATUS, HOST CONTROLLER DEVICE, AND METHOD FOR A HOST CONTROLLER FOR DETERMINING INFORMATION RELATED TO A TIME SHIFT FOR TRANSMITTING INSTRUCTIONS ON A COMMAND AND ADDRESS BUS, HOST CONTROLLER AND COMPUTER SYSTEM

(71) Applicant: Intel Corporation, Santa Clara, CA (US)

(72) Inventors: Christina Jue, Cedar Park, TX (US); Tonia Morris, Irmo, SC (US); Zhenglong Wu, Shanghai (CN); David Ellis, Beaverton, OR (US); Daniel Becerra, Zapopan (MX)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/023,150

(22) Filed: Jun. 29, 2018

(65) Prior Publication Data
US 2019/0042519 A1  Feb. 7, 2019

(51) Int. Cl.
G06F 13/42 (2006.01)
G11C 11/4096 (2006.01)
G11C 7/10 (2006.01)
G11C 11/4076 (2006.01)

(52) U.S. Cl.
CPC .......... *G06F 13/4243* (2013.01); *G06F 13/42* (2013.01); *G11C 7/10* (2013.01); *G11C 11/4076* (2013.01); *G11C 11/4096* (2013.01); *G11C 2207/2254* (2013.01)

(58) Field of Classification Search
CPC ............. G06F 13/1689; G11C 11/4076; G11C 11/4096; G11C 2207/2254; G11C 7/10
See application file for complete search history.

(56) References Cited

U.S. PATENT DOCUMENTS

| | | | |
|---|---|---|---|
| 9,025,399 B1* | 5/2015 | Morris | G11C 7/22 |
| | | | 365/193 |
| 10,175,296 B2* | 1/2019 | Batz | G01R 31/31701 |
| 2011/0235459 A1* | 9/2011 | Ware | G11C 7/04 |
| | | | 365/233.11 |
| 2018/0136866 A1* | 5/2018 | Eugenio | G06F 11/22 |

* cited by examiner

*Primary Examiner* — Brian T Misiura
(74) *Attorney, Agent, or Firm* — 2SPL Patent Attorneys PartG mbB; Kieran O'Leary

(57) ABSTRACT

A host controller apparatus for determining information related to a time shift for transmitting instructions on a command and address bus includes an interface for transmitting a plurality of instruction signals to a memory module via the command and address bus and for receiving a loopback feedback signal from the memory module. The host controller apparatus further includes a control module configured to transmit the plurality of instruction signals to the memory module via the command and address bus. The control module is configured to receive the loopback feedback signal from the memory module. The loopback feedback signal includes a looped-back composite version of the plurality of instruction signals. The control module is configured to determine the information related to the time shift for transmitting instructions on the command and address bus based on the loopback feedback signal.

20 Claims, 9 Drawing Sheets

| CADB Row | CA0 | CA1 | CA2 | CA3 | CA4 | CA5 | CA6 | CA7 | CA8 | CA9 | CA10 | CA11 | CA12 | CA13 | Parity | CS | XOR |
|---|---|---|---|---|---|---|---|---|---|---|---|---|---|---|---|---|---|
| 0 | 0 | 0 | 0 | 0 | 0 | 0 | 0 | 0 | 1 | 1 | 1 | 1 | 1 | 1 | 1 | 1 | 0 FALSE |
| 1 | 1 | 0 | 0 | 0 | 0 | 0 | 0 | 0 | 0 | 0 | 0 | 0 | 0 | 0 | 1 | 0 | 1 TRUE |
| 2 | 0 | 1 | 1 | 1 | 1 | 1 | 1 | 1 | 1 | 1 | 1 | 0 | 0 | 0 | 0 | 1 | 0 FALSE |
| 3 | 1 | 1 | 1 | 1 | 1 | 1 | 1 | 1 | 0 | 0 | 0 | 0 | 0 | 0 | 0 | 0 | 1 TRUE |
| 4 | 0 | 0 | 0 | 0 | 0 | 0 | 0 | 0 | 1 | 1 | 1 | 1 | 1 | 1 | 1 | 1 | 1 FALSE |
| 5 | 1 | 1 | 1 | 1 | 1 | 1 | 1 | 1 | 0 | 0 | 0 | 1 | 1 | 1 | 1 | 0 | 1 TRUE |
| 6 | 0 | 1 | 1 | 1 | 1 | 1 | 1 | 1 | 1 | 1 | 1 | 0 | 0 | 0 | 0 | 1 | 1 FALSE |
| 7 | 1 | 0 | 0 | 0 | 0 | 0 | 0 | 0 | 0 | 0 | 0 | 0 | 0 | 0 | 0 | 0 | 1 TRUE |
| | LFSR0 | LFSR1 | LFSR1 | LFSR1 | LFSR1 | LFSR1 | LFSR1 | ~LFSR0 | ~LFSR1 | ~LFSR1 | ~LFSR1 | ~LFSR1 | ~LFSR1 | ~LFSR1 | ~LFSR0 | | |

FIG. 5

| CADB row | Csb0 | CA13 | CA12 | CA11 | CA10 | CA9 | CA8 | CA7 | CA6 | CA5 | CA4 | CA3 | CA2 | CA1 | CA0 | Feedback example |
|---|---|---|---|---|---|---|---|---|---|---|---|---|---|---|---|---|
| 0 | 0 | 0 | 1 | 1 | 1 | 1 | 1 | 1 | 1 | 0 | 0 | 0 | 0 | 0 | 0 | 1 |
| 1 | 1 | 1 | 1 | 1 | 1 | 1 | 1 | 0 | 0 | 0 | 0 | 0 | 0 | 1 | 1 | 0 |
| 2 | 0 | 1 | 0 | 0 | 0 | 0 | 0 | 1 | 1 | 1 | 1 | 1 | 1 | 1 | 0 | 1 |
| 3 | 1 | 0 | 1 | 1 | 1 | 1 | 1 | 0 | 0 | 0 | 0 | 0 | 0 | 1 | 1 | 0 |
| 4 | 1 | 1 | 1 | 1 | 1 | 1 | 1 | 0 | 0 | 0 | 0 | 0 | 0 | 0 | 0 | 0 |
| 5 | 1 | 0 | 0 | 0 | 0 | 0 | 0 | 1 | 1 | 1 | 1 | 1 | 1 | 1 | 1 | 0 |
| 6 | 1 | 1 | 0 | 0 | 0 | 0 | 0 | 0 | 0 | 0 | 0 | 0 | 0 | 1 | 0 | 0 |
| 7 | 1 | 0 | 0 | 0 | 0 | 0 | 0 | 1 | 1 | 1 | 1 | 1 | 1 | 0 | 1 | 0 |
|  |  | ~LFSR1 | ~LFSR1 | ~LFSR1 | ~LFSR1 | ~LFSR1 | ~LFSR1 | ~LFSR0 | LFSR1 | LFSR1 | LFSR1 | LFSR1 | LFSR1 | LFSR1 | LFSR0 |  |

HOST CONTROLLER APPARATUS, HOST CONTROLLER DEVICE, AND METHOD FOR A HOST CONTROLLER FOR DETERMINING INFORMATION RELATED TO A TIME SHIFT FOR TRANSMITTING INSTRUCTIONS ON A COMMAND AND ADDRESS BUS, HOST CONTROLLER AND COMPUTER SYSTEM

FIELD

Examples relate to a host controller apparatus, a host controller device and a method for a host controller suitable for determining information related to a time shift for transmitting instructions on a command and address bus, a host controller and a computer system, more specifically, but not exclusively, to determining the information related to the time shift for transmitting instructions on the command and address bus based on a loopback feedback signal.

BACKGROUND

Volatile memory is an important component of a computer system. It may be used to intermittently store data or instructions, which are used by a processor of the computer system. To speed up the computer system, a read or write access to the volatile memory may be accelerated, e.g. by using a faster data rate or by using double-pumped transmissions of instructions or data. By accelerating the transmission of instructions or data, a signal integrity of the transmissions may be monitored to enable or improve reliable read or write access to the volatile memory.

BRIEF DESCRIPTION OF THE FIGURES

Some examples of apparatuses and/or methods will be described in the following by way of example only, and with reference to the accompanying figures, in which

FIG. 5 shows an example of a Command Address Buffer with predefined patterns and a signal to LFSR mapping;

FIG. 7 shows another example of a Command Address Buffer with predefined patterns and a signal to LFSR mapping.

DETAILED DESCRIPTION

Various examples will now be described more fully with reference to the accompanying drawIngs in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
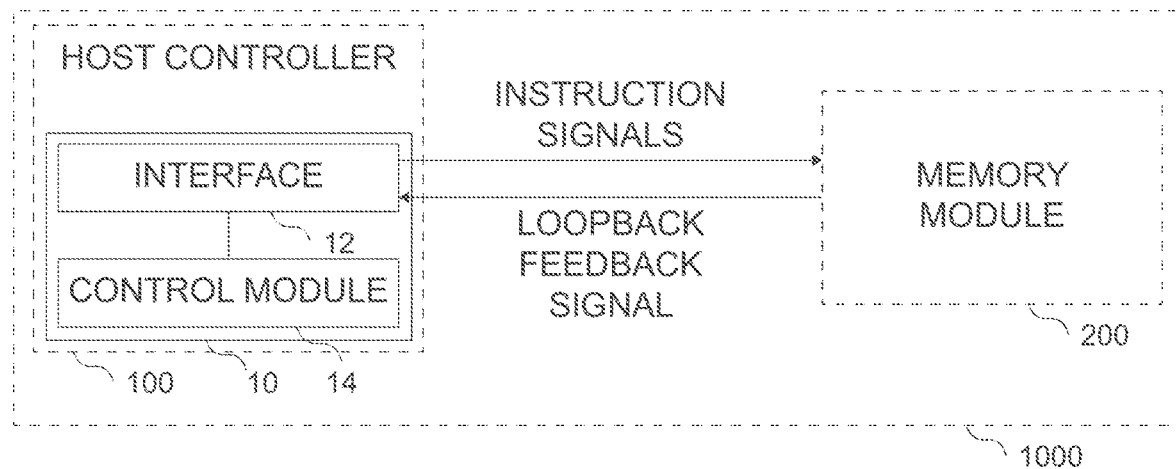
FIGS. 1a and 1b show block diagrams of examples of a host controller apparatus or of a host controller device for determining information related to a time shift for transmitting instructions on a command and address bus.
Figure 1B:
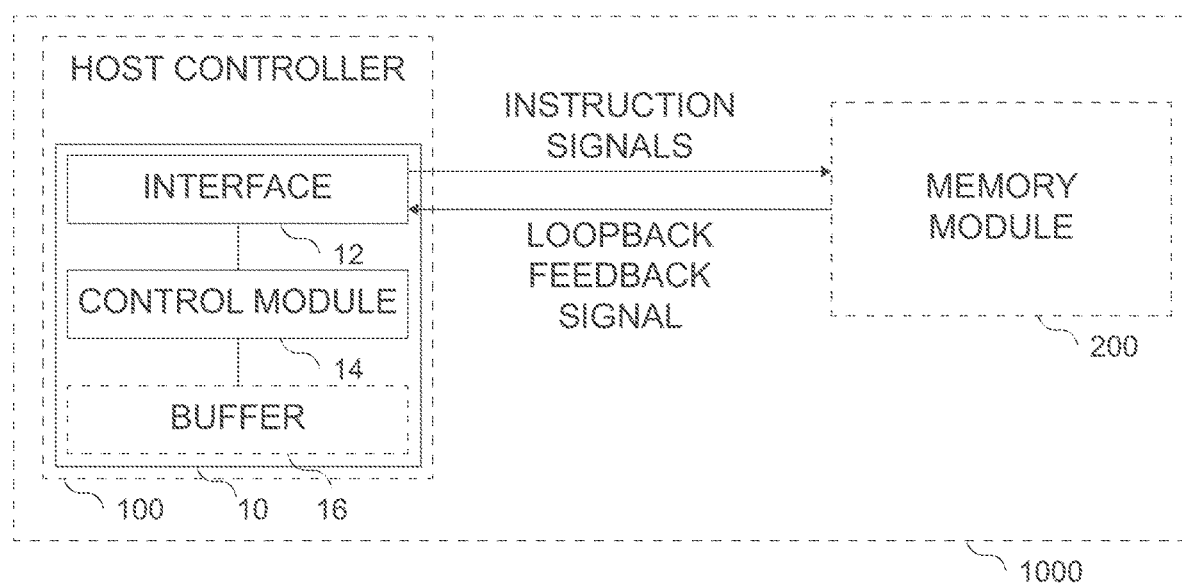

FIGS. 1a and 1b show block diagrams of examples of a host controller apparatus 10 or of a host controller device 10 for determining information related to a time shift for transmitting instructions on a command and address bus. The components of the host controller device 10 are defined as component means which correspond to the respective structural components of the host controller apparatus 10. Examples further provide a host controller 100 comprising the host controller apparatus 10 and/or the host controller device. The host controller 100 is suitable for controlling one or more memory module 200s. FIG. 1a further shows a computer system 1000 comprising the host controller 100 and the memory module 200.

The host controller apparatus 10 comprises an interface 12 for transmitting a plurality of instruction signals to a memory module 200 via the command and address bus and for receiving a loopback feedback signal from the memory module 200. The interface 12 of the host controller apparatus 10 corresponds to a means for communicating 12 of the host controller device 10. The host controller apparatus 10 further comprises a control module 14. The control module 14 of the host controller apparatus 10 corresponds to a means for controlling 14 of the host controller device 10. The control module 14 is configured to transmit the plurality of instruction signals to the memory module 200 via the command and address bus. The control module 14 is further configured to receive the loopback feedback signal from the memory module 200. The loopback feedback signal comprises a looped-back composite version of the plurality of instruction signals. The control module 14 is further configured to determine the information related to the time shift for transmitting instructions on the command and address bus based on the loopback feedback signal.

Figure 2:
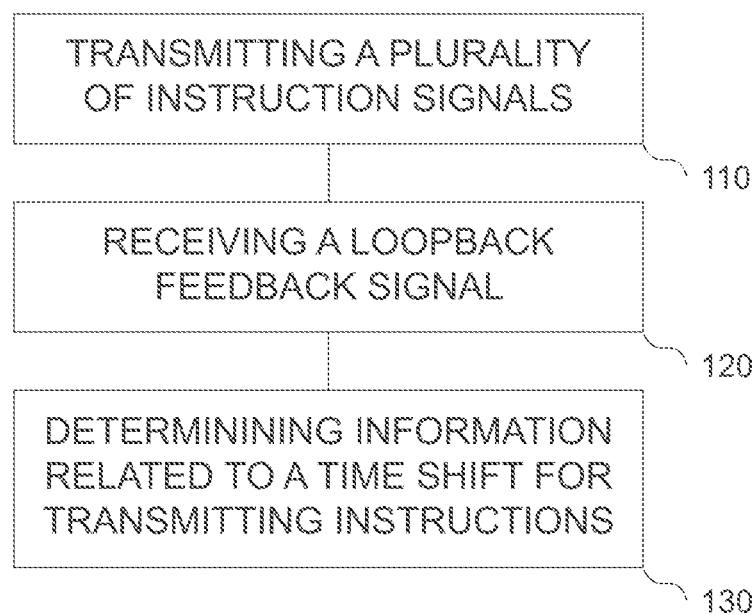
FIG. 2 illustrates a flow chart of an example of a method for determining information related to a time shift for transmitting instructions on a command and address bus.

FIG. 2 illustrates a flow chart of an example of a corresponding method for determining information related to a time shift for transmitting instructions on a command and address bus. The method comprises transmitting 110 a plurality of instruction signals to the memory module 200 via the command and address bus. The method further comprises receiving 120 a loopback feedback signal from the memory module 200. The loopback feedback signal comprises a looped-back composite version of the plurality of instruction signals. The method further comprises determining 130 the information related to the time shift for transmitting instructions on the command and address bus based on the loopback feedback signal. The method is suitable for a host controller for a memory module 200.

Using a loopback feedback signal to determine the information related to the time shift may enable evaluating the signal integrity of signals on the command and address bus at the host controller, which may enable performing a higher number of subsequent tests than if the evaluation is performed by the memory module 200.

The following description relates to the host controller 100, host controller apparatus 10 and host controller device 10 of FIGS. 1a and 1b and to the method of FIG. 2

In general, to achieve a reliable operation of the memory system, memory host controllers (e.g. the host controller 100 comprising the host controller apparatus 10) may constantly attempt to improve a timing (or time-shift) for transmitting instructions and/or data to and from the memory modules. For example, due to temperature variations or other factors, a timing, at which instructions can be successfully transmitted to memory modules may change over time. The memory host controller may attempt to compensate for these changes by adjusting a time shift, at which instructions are transmitted relative to a clock signal (e.g. of the memory host controller or of the memory module). To determine an improved or optimal timing for transmitting the instructions, according to examples, the host controller may be configured to transmit a long sequence of signal state vectors to the memory module (e.g. the plurality of instruction signals) and analyze a looped-back version of the transmitted signal state vectors that is looped back by the memory module. If a signal state of the signal state vector is sampled incorrectly/ unsuccessfully at the memory module, the signal state of the looped-back version may flip (at an odd number of incorrect samplings), and the host controller may detect the error and attempt to adjust the timing in order to arrive at a time shift, at which the instructions can be transmitted without (or with less) incorrect samplings at the memory module.

In at least some examples, the host controller apparatus 10 is a part of a (memory) host controller 100. The host controller apparatus 10 may be a memory host controller apparatus 10, the host controller device 10 may be a memory host controller device 10. The host controller apparatus 10 may be suitable for controlling a time shift of instructions transmitted via the command and address bus. In at least some examples, the memory module 200 is a dual in-line memory module 200 (DIMM), e.g. an Unbuffered/Unregistered DIMM (UDIMM) or a Registered DIMM (RDIMM). In general, the memory module may comprise computer-readable memory, e.g. one or more memory chips. The memory module may comprise random access memory (RAM), dynamic RAM (DRAM), static RAM (SRAM), non-volatile storage, any semiconductor memory, and it may be arranged in any architecture using any technology, e.g. phase change memory (PCM), dynamic random access memory (DRAM), flash memory, or DDR (double data rate memory). The memory module 200 may be a volatile memory module, e.g. a Dynamic Random Access Memory (DRAM) module, for example a DDR5 DRAM module or a DDR5 DRAM DIMM.

The host controller apparatus 10 is suitable for determining the information related to a time shift for transmitting instructions on a command and address bus. For example, the command and address bus may be a signal bus for transmitting instructions between a memory host controller and the memory module 200. The command and address bus may correspond to a command and address bus of a DDR5 (Double Data Rate memory version 5) memory system. For example, the command and address bus may be used to transmit command instructions and address instructions from the memory host controller to the memory module 200. In various examples, the command instructions and the address instructions may be transmitted in parallel, e.g. a subset of the plurality of instruction signals may be used for the command instructions and a further subset of the plurality of instruction signals may be used for the address instructions. Additionally or alternatively, the command instructions and the address instructions may be transmitted sequentially, e.g. first the command instruction and second the associated address instruction. Alternatively, the command instruction may comprise the address instruction. In some examples, the address instruction may imply the command instruction, e.g. if only one command is associated with the format of the address instruction. In some examples, the instructions might only comprise command instructions, e.g. if the entire memory is affected by the command instructions. The time shift for transmitting instructions on the command and address bus may be a timing of the plurality of instruction signals relative to a clock signal. For example, the time the instructions are transmitted may be shifted relative to the clock signal to improve a signal integrity of the instructions transmitted via the command and address bus. The time shift may be determined such that a signal "eye" of the instructions transmitted via the command and address bus improves relative to instructions transmitted using a different time shift.

Figure 3:
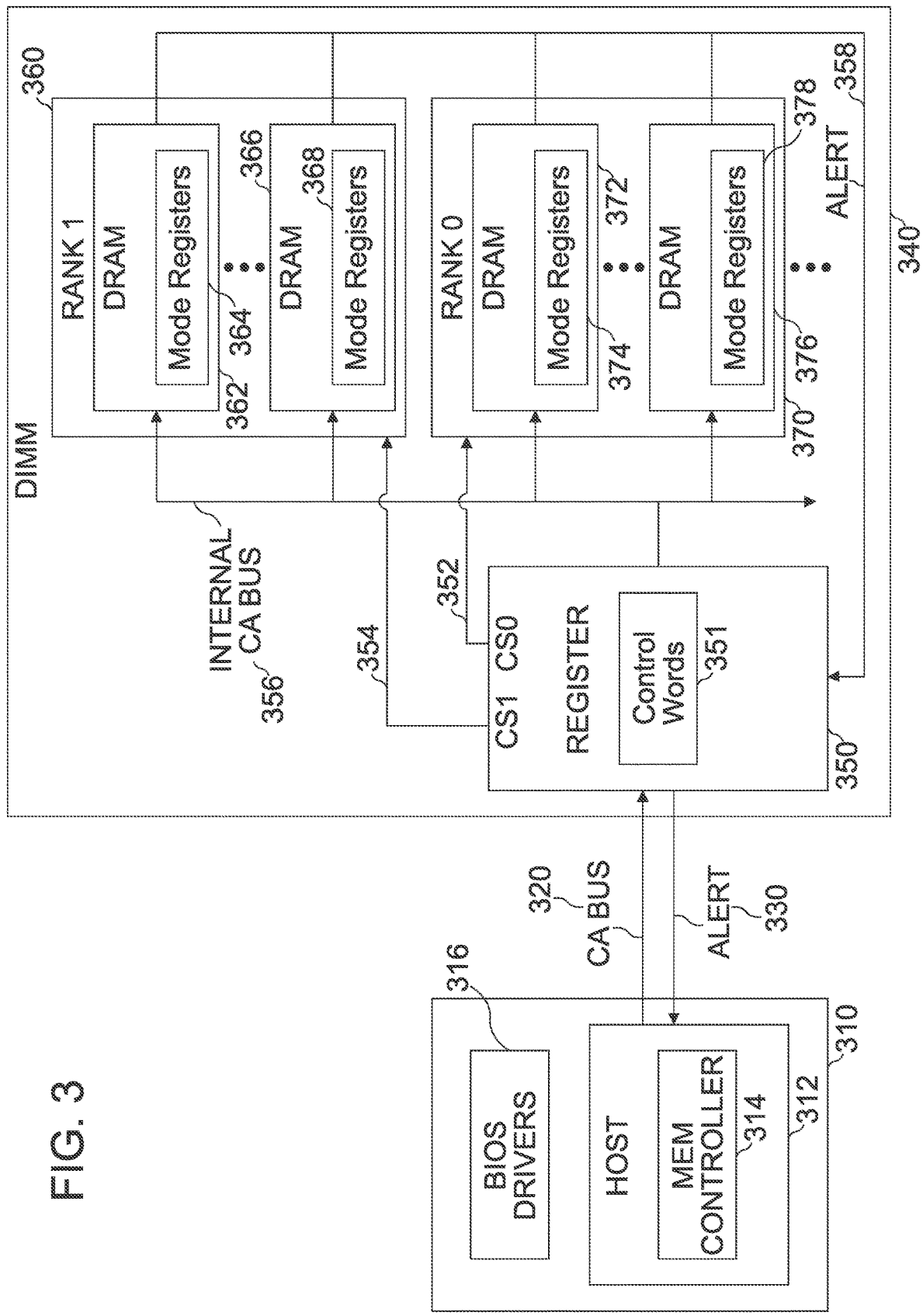
FIG. 3 shows a block diagram of an example of a system with a RDIMM memory module 200.
Figure 4:
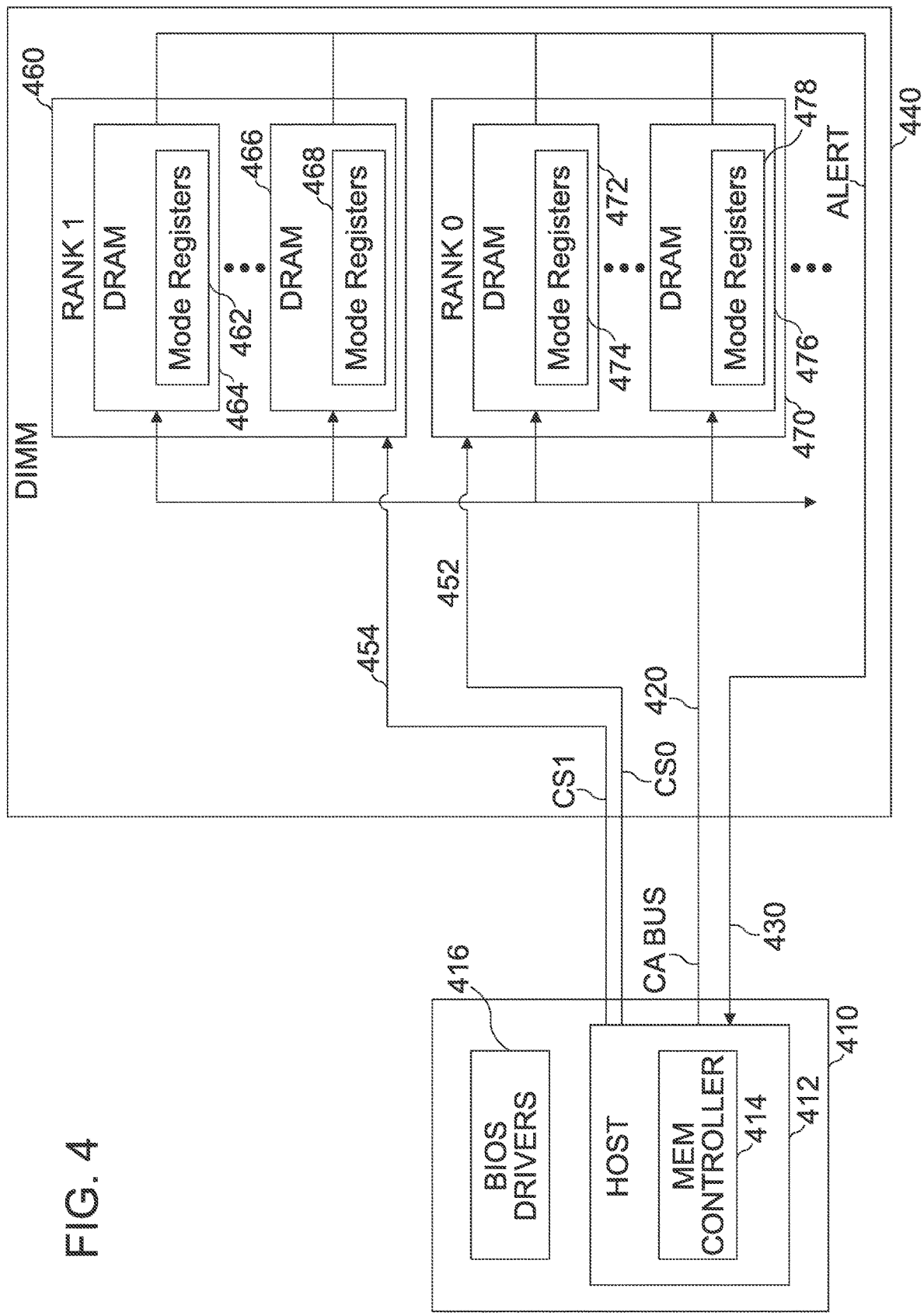
FIG. 4 shows a block diagram of an example of a system with a RDIMM memory module 200.

In at least some examples, as shown in FIG. 4, the interface 12 is configured to transmit the plurality of instruction signals to one or more dynamic random access memory modules of the memory module 200 and to receive the loopback feedback signal from the one or more dynamic random access memory modules of the memory module 200. This may enable evaluating a signal integrity of a plurality of instruction signals transmitted to an unbuffered/ unregistered dynamic random access memory. For example, the memory module 200 may be an unbuffered/unregistered dynamic random access memory module 200, e.g. a UDIMM. Alternatively or additionally, as shown in FIG. 3, the interface 12 may be configured to transmit the plurality of instruction signals to a registering clock driver (RCD) of the memory module 200 and to receive the loopback feedback signal from the registering clock driver of the memory module 200. This may enable evaluating a signal integrity of a plurality of instruction signals transmitted to a registered dynamic random access memory. For example, the memory module 200 may be a registered dynamic random access memory module 200, e.g. a RDIMM.

In various examples, the command and address bus comprises a plurality of signal lines for transmitting the plurality of instruction signals to the memory module 200. For example, the plurality of signal lines of the command and address bus may comprise a plurality of signal lines for transmitting instructions to the memory module 200, e.g. for transmitting command instructions and address instructions to the memory module 200. The plurality of signal lines of the command and address bus may comprise a signal line for a chip select signal for transmitting a chip select instruction. In at least some examples, the plurality of instruction signals may comprise one or more elements of the group of address signals, bank group signals, bank signals, a command activation signal, dual command input/address signals and a chip select signal. In at least some examples, the plurality of instruction signals might at least comprise the chip select signal, the address signals and the dual command input/address signals.

In examples, the plurality of instruction signals may comprise a sequence of signal state vectors. For example, for each clock cycle, the plurality of instruction signals may comprise one (for single data rate transmissions) or two signal state vectors (for double data rate transmissions). A signal state vector may be the state of the plurality of instruction signals at a pre-determined time relative to a clock signal, e.g. at a rising edge and/or at a falling edge of the clock signal. The control module 14 may be configured to transmit a sequence of signal state vectors within the plurality of instruction signals. The loopback feedback signal may comprise a looped-back composite version for each signal state vector of the sequence of signal state vectors. For example, the loopback feedback signal may comprise a sequence of composite versions of the sequence of signal state vectors. For each signal state vector of the sequence of signal state vectors, the loopback feedback signal may comprise a corresponding composite version of the signal state vector.

In various examples, the control module 14 may be configured to generate the sequence of signal state vectors, e.g. by generating random signal state vectors and corresponding expected results. For example, the control module 14 may be configured to generate the sequence of signal state vectors using one or more linear feedback shift registers, e.g. by generating the individual signal state vectors based on the one or more linear feedback shift registers or by generating a random identifier associated with a pre-determined signal state vector using the one or more linear feedback shift registers. For example, the control module 14 may be configured to generate the sequence of signal state vectors based on a plurality of pre-generated signal state vectors. The control module 14 may be configured to choose a signal state vector of the plurality of pre-generated signal state vector based on a random identifier generated by the one or more linear feedback shift registers. For example, the control module 14 may be configured to obtain the signal state vectors for the sequence of signal state vectors from a buffer structure 16 of the host controller apparatus (as shown in FIG. 1b). For example, the at least one buffer structure may be a command address data buffer 16 (CADB) of the host controller apparatus 10. The control module 14 may be configured to obtain signal vectors of a first plurality of signal vectors and signal vectors of a second plurality of signal vectors from at least one buffer structure 16. This may enable pre-generating the signal patterns along with their expected results.

In some examples, the control module 14 may be configured to determine the sequence of signal state vectors by choosing a signal state vector from the first plurality of signal state vectors in a first transmission state and by choosing a signal state vector from the second plurality of signal state vectors in a second transmission state. For example, the first plurality of signal state vectors may comprise instructions that are not always permitted by the memory module 200.

For example, at least some memory modules may accept certain commands (e.g. the chip select command) at least four clock cycles apart. At many memory modules, this may be the case for the "chip select" command. For example, an instruction signal of the plurality of instruction signals may be related to a chip select instruction of the memory module 200. This instruction signal might not be permitted to be asserted (e.g. set to a low value (or 0) in case of the inverted Chip Select signal) more than once every four clock cycles. To enable this, only the first subset of signal state vectors might comprise signal state vectors, in which the chip select instruction is asserted. At least a subset of signal state vectors of the first plurality of signal state vectors may assert the instruction signal of the plurality of instruction signals related to the chip select instruction. In some examples, none of the signal state vectors of the second plurality of signal state vectors might assert the instruction signal of the plurality of instruction signals related to the chip select instruction. The control module 14 may be configured to alternate between the first transmission state and the second transmission state based on a pre-defined transmission schedule. In the case of the chip select instruction, the control module 14 may be configured to alternate between the first transmission state and the second transmission state such, that the first transmission state is used only once every four clock cycles. For example, the control module 14 may be configured to choose a signal state vector from the first plurality of signal state vectors for a first pre-determined amount of clock cycles, to choose a signal state vector from the second plurality of signal state vectors for a second pre-determined amount of clock cycles, and then start over and choose a signal state vector from the first plurality of signal state vectors for the first pre-determined amount of clock cycles. The pre-determined transmission schedule may specify the first pre-determined amount of clock cycles and the second pre-determined amount of clock cycles. For example, the pre-defined transmission schedule may be based on a maximal rate commands are accepted at by the memory module 200, e.g. a maximal rate, at which instructions of a pre-defined type are accepted by the memory module 200. For example, the pre-defined transmission schedule may specify that the first transmission state lasts a single clock cycle, and that the second transmission state lasts at least three clock cycles, e.g. three, four, five, six or seven clock cycles. This may enable choosing the commands based on a maximal rate commands are accepted at by the memory module 200.

In various examples, the control module 14 may be configured to transmit the plurality of instruction signals to the memory module 200 using a single-pumped signal transmission. Alternatively, the control module 14 may be configured to transmit the plurality of instruction signals to the memory module 200 using a double-pumped signal transmission. For example, the control module 14 may be configured to transmit the plurality of instruction signals via the interface 12 based on a rising edge and based on a falling edge of a clock signal associated with the plurality of instruction signals. The plurality of instruction signals may be transmitted to the memory module 200 using a double data rate transmission. This may enable testing for effects of inter symbol interference at double data rate transmissions.

The control module 14 is configured to receive the loopback feedback signal from the memory module 200 via the interface 12. For example, the control module 14 may be configured to receive the loopback feedback signal from the memory module 200 via an alert signal (e.g. ALERT_n) from the memory module 200. In at least some examples, the loopback feedback signal may be a single signal, e.g. capable of transmitting a single signal state at a time. The loopback feedback signal comprises a looped-back composite version of the plurality of instruction signals. In at least some examples, the looped back composite version is not the result of a parity check by the memory module 200. For example, the loopback feedback signal may comprise a version of the plurality of instruction signals composed by the memory module 200 based on an asynchronous or single-clock-cycle composition assignment. For example, the composition assignment may be an XOR (eXclusive OR) assignment. Alternatively, the composition assignment may be a different single-clock-cycle assignment. The loopback feedback signal may comprise a looped-back XOR-ed version of the plurality of instruction signals. This may enable a direct feedback signal with a low complexity operation at the memory module 200 while enabling a simple parity check at the host controller. For example, the looped-back XOR-ed version of the plurality of instruction signals may be based on an XOR over (all of) the plurality of instruction signals. For example, the if an even number of high values (or 1s) is sampled among the plurality of instruction signals at the memory module 200 for a signal state vector, the corresponding signal state of the loopback feedback signal may be a low value (or 0). If an odd number of high values (or binary 1s) is sampled among the plurality of instruction signals at the memory module 200 for a signal state vector, the corresponding signal state of the loopback feedback signal may be a high value (or binary 1).

In at least some examples, the loopback feedback signal is a direct (e.g. looped-back) response to the plurality of instruction signals. For example, a delay between transmitting a signal state vector within the plurality of instruction signals a corresponding composite version of the signal state vector in the loopback feedback signal may be less than 10 clock cycles (or less than 8 clock cycles, less than 6 clock cycles, less than 5 clock cycles, less than 4 clock cycles, less 3 clock cycles, less than 2 clock cycles, less than 1 clock cycles). The delay may be measured between asserting the signal state vector at the interface 12 and receiving the corresponding composite version of the signal state vector in the loopback feedback signal. Alternatively, the delay may be measured between a time the signal state vector arrives at the memory module 200 and the corresponding composite version of the signal state vector in the loopback feedback signal is transmitted by the memory module 200. For example, the plurality of instruction signals may be sampled at the memory module 200 in a clock cycle and the looped-back feedback function may be generated in the same (or the following) clock cycle and (asynchronously) transmitted to the host controller 100 without transmission synchronization, e.g. independent of a clock signal of the memory module 200. For example, as indicated by the term "loopback feedback signal", except for the sampling of the plurality of feedback signal and the composition of the sampled signals, the loopback feedback signal may be unprocessed by the memory module 200. For example, the control module 14 may be configured to perform the (entire) parity check for the transmitted plurality of instruction signals. All of the parity operations may be performed by the host controller 100, e.g. by the control module 14 of the host controller apparatus 10. The control module 14 may be configured to sample the loopback feedback signal received via the interface 12 asynchronously. This may enable evaluating the asynchronously transmitted signal received from the memory module 200.

The control module 14 is configured to determine the information related to the time shift for transmitting instructions on the command and address bus based on the loopback feedback signal. For example, the loopback feedback signal may comprise a looped-back composite version of the plurality of instruction signals as it is sampled by the memory module 200. For example, the loopback feedback signal may be based on erroneously sampled versions of the plurality of instruction signals. For example, if an odd number of the plurality of instruction signals is sampled erroneously at the memory module 200, the loopback feedback signal may be inverted, and the control module 14 may be configured to detect, that at least one (or an odd number) of the plurality of instruction signals was sampled erroneously at the memory module 200 (based on the inverted signal). The control module 14 may be configured to determine the information related to the time shift for transmitting instructions on the command and address bus by shifting the transmission of the plurality of instruction signals, so a number of erroneously sampled instruction signals decreases.

In at least some examples, the control module 14 may be configured to compare the looped-back composite version for each signal state vector of the sequence of signal state vectors to an expected result for each signal state vector of the sequence of signal state vectors. The expected result may be a value that is expected within the loopback feedback signal if all of the plurality of instruction signals is successfully (e.g. correctly) sampled by the memory module. For example, the expected result for each signal state vector may be stored in the buffer structure 16 along with the corresponding signal state vector. For example, if the received composite version of a signal state vector does not match the expected result for the signal state vector, the comparison (and the transmission of the signal state vector) may be deemed unsuccessful. If the received composite version of a signal state vector matches the expected result for the signal state vector, the comparison (and transmission of the signal state vector) may be deemed successful or unsure (e.g. if erroneously sampled instruction signals for an even number of instruction signals are probable). The control module 14 may be configured to determine the information related to the time shift for transmitting instructions on the command and address bus based on the comparison of the looped-back composite version for each signal state vector of the sequence of signal state vectors and the expected result for each signal state vector of the sequence of signal state vectors. This may enable detecting, whether the signal state vectors were successfully transmitted to the memory module 200. For example, the control module 14 may be configured to count the number of successful comparisons or the number of unsuccessful comparisons, e.g. to determine the information related to the time shift for transmitting instructions on the command and address bus. This may enable performing a high number of tests sequentially to detect multi-bit failures.

One reason for erroneously sampling a signal at a receiver is a violation of a setup and hold time at the receiver. The setup and hold time indicates, how long before and after a clock signal edge at which a signal is sampled the signal has to be stable at the receiver. The control module 14 may be configured to determine information related to a setup and/or hold time of the plurality of instruction signals based on the loopback feedback signal. For example, the control module 14 may be configure to shift (e.g. sweep) the timing (or time shift) of transmitting the plurality of feedback signals relative to a clock signal (e.g. a clock signal of the host controller 100 or of the memory module 200) based on the loopback feedback signal, e.g. based on the counted number of successful comparisons or the number of unsuccessful comparisons. For example, if the number of unsuccessful comparison decreases after shifting the timing (or time shift) of transmitting the plurality of feedback signals relative to the clock signal, the control module 14 may be further configured to maintain the timing (or time shift) (if the number of unsuccessful comparisons is low enough) or to continue shifting the timing (or time shift) in the same direction until the number of unsuccessful comparisons increases again. The control module 14 may be configured to determine the information related to the setup and/or hold time of the plurality of instruction signals based on the number of successful comparisons or the number of unsuccessful comparisons. The control module 14 may be configured to determine the information related to the setup and/or hold time of the plurality of the plurality of instruction signals based on a timing (or time shift) for transmitting the plurality of instruction signals relative to the clock signal at which a number of unsuccessful comparisons is decreased (e.g. minimal) compared to a number of unsuccessful comparisons at other timings (or time shifts) for transmitting the plurality of instruction signals. The control module 14 may be configured to determine the information related to the time shift for transmitting instructions on the command and address bus based on the information related to the setup and/or hold time of the plurality of instruction signals. Using the loopback feedback signal to evaluate the signal/hold time of the instruction signals may enable a fine-grained evaluation of the setup/hold time at the host controller. For example, the control module 14 may be configured to determine the information related to the time shift for transmitting instructions on the command and address bus based on a timing (or time shift) for transmitting the plurality of instruction signals relative to the clock signal at which a number of unsuccessful comparisons is decreased (e.g. minimal) compared to a number of unsuccessful comparisons at other timings (or time shifts) for transmitting the plurality of instruction signals. In at least some examples, the information related to the time shift for transmitting instructions on the command and address bus may indicate a good or optimal time relative to a clock signal, at which instructions are to be transmitted via the command and address bus to achieve a high (e.g. optimal) success rate when sampling the instructions at the memory module 200.

In at least some examples, the control module 14 may be configured to control a time shift of instructions transmitted via the command and address bus relative to a clock signal based on the information related to the time shift for transmitting instructions on the command and address bus. For example, the control module 14 may be configured to control the time shift of instructions transmitted via the command and address bus relative to a clock signal during a normal operation of the memory module based on the information related to the time shift for transmitting instructions on the command and address bus gathered during a training operation of the memory module. For example, the control module 14 may be configured to adjust the time shift of instructions transmitted via the command and address bus relative to the clock signal based on a timing (or time shift) for transmitting the plurality of instruction signals relative to the clock signal at which a number of unsuccessful comparisons is decreased (e.g. minimal) compared to a number of unsuccessful comparisons at other timings (or time shifts) for transmitting the plurality of instruction signals (during the training operation). This may enable reducing an error rate for instructions transmitted via the command and address bus.

In various examples, the control module 14 may be configured to determine the information related to the time shift for transmitting instructions on the command and address bus individually for the plurality of signal lines (e.g. individually for each signal line of the plurality of signal lines). This may enable reducing effects from crosstalk on adjacent signal traces. For example, the control module 14 may be configured to shift (e.g. sweep) the timing (or time shift) of transmitting the plurality of feedback signals relative to a clock signal (e.g. a clock signal of the host controller 100 or of the memory module 200) based on the loopback feedback signal individually for the plurality of signal lines. For example, the timing (or time shift) of transmitting the plurality of feedback signals may vary among the plurality of instruction signals and/or among the plurality of signal lines. For example, the control module 14 may be configured to determine the information related to the time shift for transmitting instructions on the command and address bus based on a timing (or time shift) for transmitting individual instruction signals of the plurality of instruction signals relative to the clock signal at which a number of unsuccessful comparisons is decreased (e.g. minimal) compared to a number of unsuccessful comparisons at other timings (or time shifts) for transmitting the plurality of instruction signals. The control module 14 may be configured to control the time shift of instructions transmitted via the command and address bus relative to a clock signal individually for the plurality of signal lines (e.g. individually for each signal line of the plurality of signal lines). This may enable reducing effects from crosstalk on adjacent signal traces.

The interface 12 may correspond to one or more inputs and/or outputs for receiving and/or transmitting information, which may be in digital (bit) values or analog signal states according to a specified code, within a module, between modules or between modules of different entities.

In examples, the control module 14 may be implemented using one or more control units, one or more control devices, any means for controlling, such as a processor, a computer or a programmable hardware component being operable with accordingly adapted software. In other words, the described function of the control module 14 may as well be implemented in software, which is then executed on one or more programmable hardware components. Such hardware components may comprise a general-purpose processor, a Digital Signal Processor (DSP), a micro-controller, etc.

More details and aspects of the host controller 100, the host controller apparatus 10, the host controller device 10 and/or the method are mentioned in connection with the proposed concept or one or more examples described below (e.g. FIGS. 3 to 8). The host controller 100, the host controller apparatus 10, the host controller device 10 and/or the method may comprise one or more additional optional features corresponding to one or more aspects of the proposed concept or one or more examples described above or below.

Examples may provide a method to measure and optimize or improve command signal timing from host to DDR5 DRAM (Double Data Rate version 5 Dynamic Random Access Memory) or DDR5 RCD (Register Clock Driver) (e.g. of the memory module 200).

DDR5 RDIMM (Registered Dual In-line Memory module 200) specifications may allow for double data rate commands to be issued, which may cause commands to be issued at a higher frequency as compared with previous technology (i.e. DDR4). Due to the increase in command frequency, additional effects such as ISI (Inter Symbol Interference) and signal to signal crosstalk may be exercised when measuring the command signal timings. The method of measuring command signal timing according to examples may exercise those effects without violating DDR5 DRAM protocol and may return sufficiently stressful measurements of setup/hold time of target command cycle.

Some methods of training Command/Address (CA) Parity checking to measure CA signal margins may use the host controller to generate patterns on the single CA signal being measured, driven from host to DRAM or from host to RCD. These methods may be used to train the timings from host to DDR4 DRAMs on UDIMM/SODIMM (Unregistered DIMM or Unbuffered DIMM/Small Outline DIMM), and from the host controller to the DDR4 Register on RDIMM/LRDIMM (Registered DIMM/Load Reduced DIMM).

The pattern generation on a single CA signal output might not be sufficient to exercise additional ISI and signal to signal crosstalk. These effects may be accounted for with higher command/address signal frequency and with the addition of double data rate commands with DDR5 RCD. The resulting margin measurement might be too large and might not be satisfactory for command timing improvement or optimization.

DDR4 DRAM technology might not have the loopedback training capability needed to exercise the patterns according to examples. While DDR4 RCD had the capability to train with similar patterns, the requirements listed might not apply to single data rate commands at lower frequency.

Examples provide a method to measure CA signal timing margins from host to DDR5 DRAMs. Examples may rely on the host memory control with a pseudo random pattern generator. Examples may also rely on target DDR5 DRAM or RCD to have a looped-back feedback mechanism.

Examples may enable improving or optimizing the CA signal timing from host to DDR5 RCD or from host to DDR5 DRAM. This method may allow the system to operate at higher frequencies and with command double data rate. Examples may offer a method to improve CA setup/hold timings within the existing command "eye", and may better account for effects like signal to signal crosstalk and ISI.

Examples may apply to systems with a host and RDIMM, as seen in FIG. 3, or a host and UDIMM, as seen in FIG. 4.

FIG. 3 shows a block diagram of an example of a system with a RDIMM memory module 200 340. The computer system 310 comprises a BIOS (Basic Input/Output System) block 316 and a memory host 312 with a memory controller 314 (e.g. the host controller 100 and/or the host controller apparatus 10). The memory host 312 is configured to provide a Command/Address (CA) signal via a CA bus 320 to a register block 350 of a DIMM 340 (e.g. the memory module 200). The register block 350 comprises a control words block 351, and is configured to provide a Chip Select (CS) signal (CS0 352, CS1 354) to a "Rank 0" 370 (CS0) and a "Rank 1" 360 (CS1) of the DIMM 340. The register block 350 is further configured to provide Command/Address instructions via an internal C/A bus 356 to DRAMs 362, 366 of "Rank 1" and to DRAMs 372, 376 of "Rank 0". The DRAMs 362, 366, 372, 376 each comprise mode registers 364, 368, 374, 378. The DRAMs 362, 366, 372, 376 are configured to provide an ALERT signal 358 to the register block 350, which is configured to provide an alert signal 330 to the memory host 312.

FIG. 4 shows a block diagram of an example of a system with a UDIMM memory module 200. 440. The computer system 410 comprises a BIOS (Basic Input/Output System) block 416 and a memory host 412 with a memory controller 414 (e.g. the host controller 100 and/or the host controller apparatus 10). The memory host 412 is configured to provide a Chip Select (CS) signal (CS0 452, CS1 454) to a "Rank 0" 470 (CS0) and a "Rank 1" 460 (CS1) of the DIMM 440 (e.g. the memory module 200). The memory host 412 is configured to provide a Command/Address (CA) signal via a CA bus 420 to DRAMs 462, 466 of "Rank 1" and to DRAMs 472, 476 of "Rank 0". The DRAMs 462, 466, 472, 476 each comprise mode registers 464, 468, 474, 478. The DRAMs 462, 466, 472, 476 are configured to provide an ALERT signal 430 to the memory host 412.

Examples of the method may exercise effects like ISI and signal to signal crosstalk during margin measurement. At least some examples of the method may also comply with the DDR5 protocol requirement that commands (e.g. Chip Select commands) be asserted at least 4 clock cycles apart.

To do so, at least some examples may utilize the host pseudo random pattern generator to select C/A traffic from a predefined set of patterns (e.g. the plurality of signal state vectors, the first plurality of signal state vectors and/or the second plurality of signal state vectors), which may be stored in a command address data buffer (CADB) on the host (e.g. the buffer structure 16). The CADB rows may be selected by a combination of a buffer and an LFSR generated address. The buffer may allow a row to be selected from the first four entries in CADB for one cycle and the second four entries in the CADB for the remaining three cycles. The LFSR generated address may allow a row to be selected within the four entries. Example programming of the buffer is demonstrated in FIG. 5.

FIG. 5 may show a Command Address Buffer with predefined patterns (e.g. the plurality of signal state vectors) and the signal to LFSR mapping. FIG. 5 shows column 510 for the CADB row number the signal values CA0-C13 520 are associated with, column 530 shows the corresponding parity signal (1 for an uneven number of 1s in the CA0-C13 520, 0 for an even number of 1s), column 540 indicates the (inverted) Chip Select command (CS_n) and column 550 shows the expected XOR value returned (e.g. the loopback feedback signal), e.g. via the ALERT signal.

Figure 6:
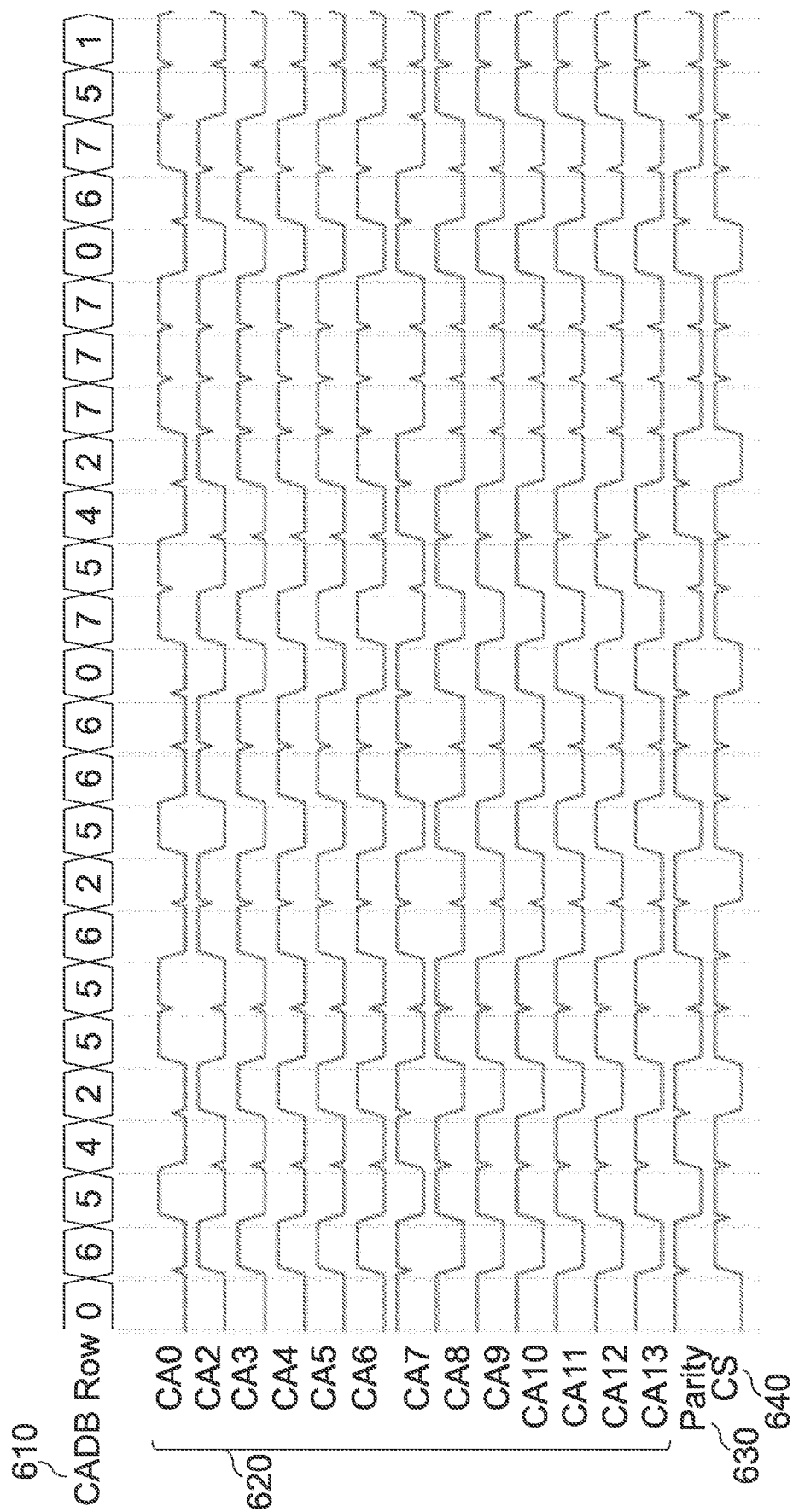
FIG. 6 shows a corresponding example waveform resulting from previous command address buffer and LFSR assignments.

This programming may allow the command signals to be asserted by the host. FIG. 6 may show a waveform resulting from previous command address buffer and LFSR assignments. As shown in FIG. 6, one cycle may be issued where CS may be selected, randomly selected from rows 0 through 3 of the buffer. Three cycles may be issued without CS asserted, randomly selected from the rows 4 through 7 of the buffer. FIG. 6 shows the corresponding signal output over a plurality of clock signals, showing the CADB row number 620, the signal values CA0-C13 620 (bar CA1), the parity signal 630 and the Chip Select Signal 640. Corresponding numbers (e.g. 510 and 610) may indicated the same (or similar) signal.

Figure 8A:
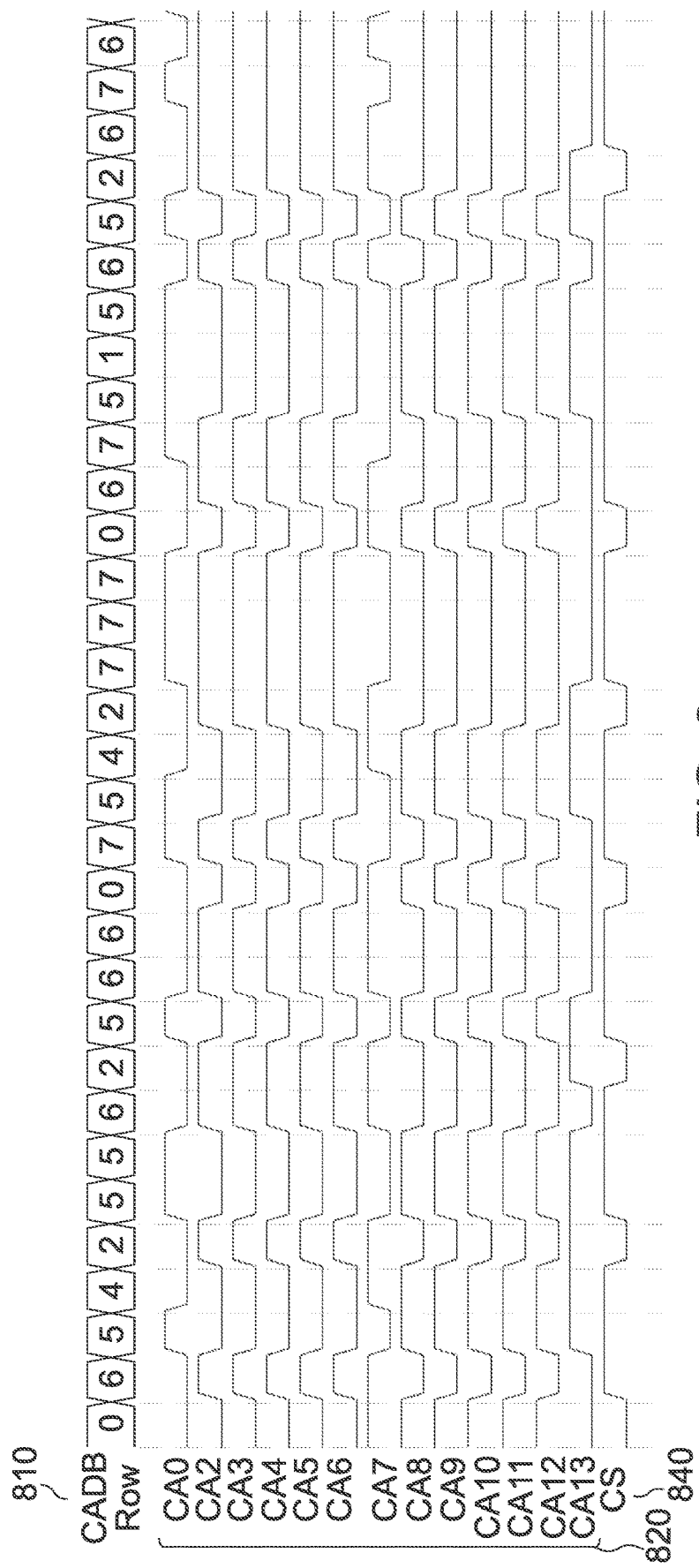
FIGS. 8a and 8b show a corresponding example waveform resulting from previous command address buffer and LFSR assignments.
Figure 8B:
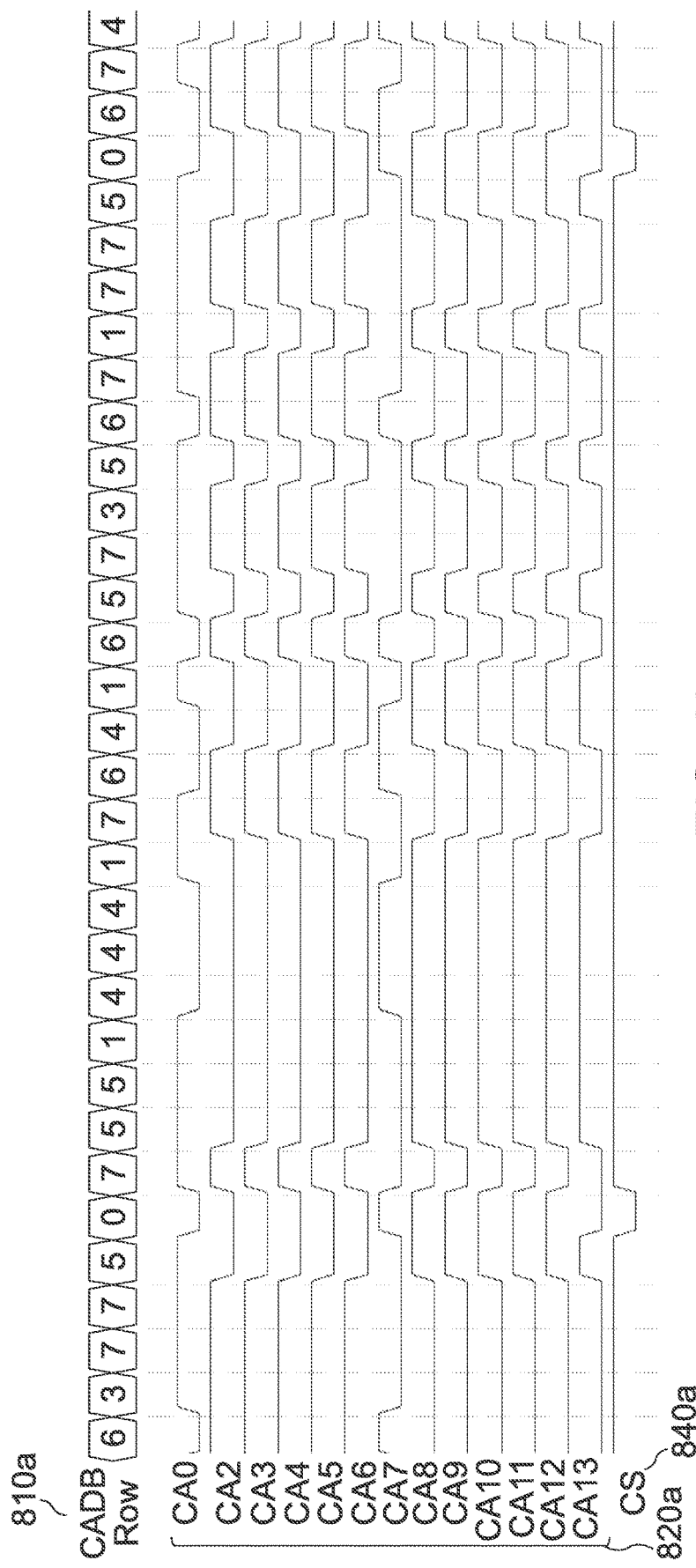

FIGS. 7 and 8a; 8b provide another example. FIG. 7 shows column 710 for the CADB row number the signal values CA0-C13 720 are associated with, column 740 indicates the (inverted) Chip Select command (CS_n) and column 750 shows the expected XOR value returned (e.g. the loopback feedback signal), e.g. via the ALERT signal. FIGS. 8a and 8b show the corresponding signal output over a plurality of clock cycles, showing the CADB row number 810, 810a, the signal values CA0-C13 820, 820a (bar CA1) and the Chip Select signal 840, 840a. For better readability, FIGS. 8a and 8b are part of the same signal sequence. Reference signs with the suffix "a" correspond to the homonymous reference signs without the suffix.

Examples may enable CA looped-back mode in the DDR5 DRAM or the DDR5 RCD. This may cause the target to XOR the CA signals together and return the result to the host on the Alert pin. From this feedback, hold/setup time (e.g. the information related to the time shift for transmitting instructions on the command and address bus) may be measured.

The aspects and features mentioned and described together with one or more of the previously detailed examples and figures, may as well be combined with one or more of the other examples in order to replace a like feature of the other example or in order to additionally introduce the feature to the other example.

Example 1 relates to a host controller apparatus 10 for determining information related to a time shift for transmitting instructions on a command and address bus. The host controller apparatus 10 includes an interface 12 for transmitting a plurality of instruction signals to a memory module 200 via the command and address bus and for receiving a loopback feedback signal from the memory module 200. The host controller apparatus 10 includes a control module 14 configured to transmit the plurality of instruction signals to the memory module 200 via the command and address bus. The control module 14 is configured to receive the loopback feedback signal from the memory module 200. The loopback feedback signal includes a looped-back composite version of the plurality of instruction signals. The control module 14 is configured to determine the information related to the time shift for transmitting instructions on the command and address bus based on the loopback feedback signal.

Example 2 may include the subject matter of example 1, wherein the control module 14 is configured to determine information related to a setup and/or hold time of the plurality of instruction signals based on the loopback feedback signal, and to determine the information related to the time shift for transmitting instructions on the command and address bus based on the information related to the setup and/or hold time of the plurality of instruction signals.

Example 3 may include the subject matter of one of the examples 1 to 2, wherein the loopback feedback signal includes a looped-back XOR-ed version of the plurality of instruction signals.

Example 4 may include the subject matter of one of the examples 1 to 3, wherein the control module 14 is configured to sample the loopback feedback signal received via the interface 12 asynchronously.

Example 5 may include the subject matter of one of the examples 1 to 4, wherein the control module 14 is configured to transmit a sequence of signal state vectors within the plurality of instruction signals, wherein the loopback feedback signal includes a looped-back composite version for each signal state vector of the sequence of signal state vectors.

Example 6 may include the subject matter of example 5, wherein the control module 14 is configured to determine the sequence of signal state vectors by choosing a signal state vector from a first plurality of signal state vectors in a first transmission state and by choosing a signal state vector from a second plurality of signal state vectors in a second transmission state, and wherein the control module 14 is configured to alternate between the first transmission state and the second transmission state based on a predefined transmission schedule.

Example 7 may include the subject matter of example 6, wherein the predefined transmission schedule specifies, that the first transmission state lasts a single clock cycle, and that the second transmission state lasts at least three clock cycles.

Example 8 may include the subject matter of one of the examples 6 or 7, wherein an instruction signal of the plurality of instruction signals is related to a chip select instruction of the memory module 200, wherein at least a subset of signal state vectors of the first plurality of signal state vectors assert the instruction signal of the plurality of instruction signals related to the chip select instruction.

Example 9 may include the subject matter of one of the examples 6 to 8, wherein the control module 14 is configured to obtain signal vectors of the first plurality of signal vectors and signal vectors of the second plurality of signal vectors from at least one buffer structure 16.

Example 10 may include the subject matter of example 9, wherein the at least one buffer structure is a command address data buffer 16 of the host controller apparatus 10.

Example 11 may include the subject matter of one of the examples 5 to 10, wherein the control module 14 is configured to compare the looped-back composite version for each signal state vector of the sequence of signal state vectors to an expected result for each signal state vector of the sequence of signal state vectors, wherein the control module 14 is configured to determine the information related to the time shift for transmitting instructions on the command and address bus based on the comparison of the looped-back composite version for each signal state vector of the sequence of signal state vectors and the expected result for each signal state vector of the sequence of signal state vectors.

Example 12 may include the subject matter of example 11, wherein the control module 14 is configured to count the number of successful comparisons or the number of unsuccessful comparisons to determine the information related to the time shift for transmitting instructions on the command and address bus.

Example 13 may include the subject matter of one of the examples 1 to 12, wherein the control module 14 is configured to control a time shift of instructions transmitted via the command and address bus relative to a clock signal based on the information related to the time shift for transmitting instructions on the command and address bus.

Example 14 may include the subject matter of example 13, wherein the command and address bus includes a plurality of signal lines, wherein the control module 14 is configured to control the time shift of instructions transmitted via the command and address bus relative to a clock signal individually for the plurality of signal lines.

Example 15 may include the subject matter of one of the examples 1 to 14, wherein the command and address bus includes a plurality of signal lines, wherein the control module 14 is configured to determine the information related to the time shift for transmitting instructions on the command and address bus individually for the plurality of signal lines.

Example 16 may include the subject matter of one of the examples 1 to 15, wherein the control module 14 is configured to transmit the plurality of instruction signals to the memory module 200 using a double-pumped signal transmission.

Example 17 may include the subject matter of one of the examples 1 to 16, wherein the memory module 200 is a dual inline memory module 200.

Example 18 may include the subject matter of one of the examples 1 to 17, wherein the interface 12 is configured to transmit the plurality of instruction signals to one or more dynamic random access memory modules of the memory module 200 and to receive the loopback feedback signal from the one or more dynamic random access memory modules of the memory module 200.

Example 19 may include the subject matter of one of the examples 1 to 18, wherein the interface 12 is configured to transmit the plurality of instruction signals to a registering clock driver of the memory module 200 and to receive the loopback feedback signal from the registering clock driver of the memory module 200.

Example 20 relates to a host controller 100 for a memory module 200, the host controller 100 including the host controller apparatus 10 according to one of the examples 1 to 19.

Example 21 relates to a computer system 1000 including the host controller 100 according to example 20.

Example 22 relates to a host controller device 10 for determining information related to a time shift for transmitting instructions on a command and address bus. The host controller device 10 includes a means for communicating 12 for transmitting a plurality of instruction signals to a memory module 200 via the command and address bus and for receiving a loopback feedback signal from the memory module 200. The host controller device 10 further includes a means for controlling 14 configured for transmitting the plurality of instruction signals to the memory module 200 via the command and address bus. The means for controlling 14 is configured for receiving the loopback feedback signal from the memory module 200. The loopback feedback signal includes a looped-back composite version of the plurality of instruction signals. The means for controlling 14 is configured for determining the information related to the time shift for transmitting instructions on the command and address bus based on the loopback feedback signal.

Example 23 may include the subject matter of example 22, wherein the means for controlling 14 is configured for determining information related to a setup and/or hold time of the plurality of instruction signals based on the loopback feedback signal, and for determining the information related to the time shift for transmitting instructions on the command and address bus based on the information related to the setup and/or hold time of the plurality of instruction signals.

Example 24 may include the subject matter of one of the examples 22 or 23, wherein the loopback feedback signal includes a looped-back XOR-ed version of the plurality of instruction signals.

Example 25 may include the subject matter of one of the examples 22 to 24, wherein the means for controlling 14 is configured for sampling the loopback feedback signal received via the means for communicating 12 asynchronously.

Example 26 may include the subject matter of one of the examples 22 to 25, wherein the means for controlling 14 is configured for transmitting a sequence of signal state vectors within the plurality of instruction signals, wherein the loopback feedback signal includes a looped-back composite version for each signal state vector of the sequence of signal state vectors.

Example 27 may include the subject matter of example 26, wherein the means for controlling 14 is configured for determining the sequence of signal state vectors by choosing a signal state vector from a first plurality of signal state vectors in a first transmission state and by choosing a signal state vector from a second plurality of signal state vectors in a second transmission state, and wherein the means for controlling 14 is configured for alternating between the first transmission state and the second transmission state based on a predefined transmission schedule.

Example 28 may include the subject matter of example 27, wherein the predefined transmission schedule specifies, that the first transmission state lasts a single clock cycle, and that the second transmission state lasts at least three clock cycles.

Example 29 may include the subject matter of one of the examples 27 or 28, wherein an instruction signal of the plurality of instruction signals is related to a chip select instruction of the memory module 200, wherein at least a subset of signal state vectors of the first plurality of signal state vectors assert the instruction signal of the plurality of instruction signals related to the chip select instruction.

Example 30 may include the subject matter of one of the examples 27 to 29, wherein the means for controlling 14 is configured for obtaining signal vectors of the first plurality of signal vectors and signal vectors of the second plurality of signal vectors from at least one buffer structure 16.

Example 31 may include the subject matter of example 30, wherein the at least one buffer structure is a command address data buffer 16 of the host controller device 10.

Example 32 may include the subject matter of one of the examples 26 to 31, wherein the means for controlling 14 is configured for comparing the looped-back composite version for each signal state vector of the sequence of signal state vectors to an expected result for each signal state vector of the sequence of signal state vectors, wherein the means for controlling 14 is configured for determining the information related to the time shift for transmitting instructions on the command and address bus based on the comparison of the looped-back composite version for each signal state vector of the sequence of signal state vectors and the expected result for each signal state vector of the sequence of signal state vectors.

Example 33 may include the subject matter of example 32, wherein the means for controlling 14 is configured for counting the number of successful comparisons or the number of unsuccessful comparisons to determine the information related to the time shift for transmitting instructions on the command and address bus.

Example 34 may include the subject matter of one of the examples 22 to 33, wherein the means for controlling 14 is configured for controlling a time shift of instructions transmitted via the command and address bus relative to a clock signal based on the information related to the time shift for transmitting instructions on the command and address bus.

Example 35 may include the subject matter of example 34, wherein the command and address bus includes a plurality of signal lines, wherein the means for controlling 14 is configured for controlling the time shift of instructions transmitted via the command and address bus relative to a clock signal individually for the plurality of signal lines.

Example 36 may include the subject matter of one of the examples 22 to 35, wherein the command and address bus includes a plurality of signal lines, wherein the means for controlling 14 is configured for determining the information related to the time shift for transmitting instructions on the command and address bus individually for the plurality of signal lines.

Example 37 may include the subject matter of one of the examples 22 to 36, wherein the means for controlling 14 is configured for transmitting the plurality of instruction signals to the memory module 200 using a double-pumped signal transmission.

Example 38 may include the subject matter of one of the examples 22 to 37, wherein the memory module 200 is a dual inline memory module 200.

Example 39 may include the subject matter of one of the examples 22 to 38, wherein the means for communicating 12 is configured for transmitting the plurality of instruction signals to one or more dynamic random access memory modules of the memory module 200 and for receiving the loopback feedback signal from the one or more dynamic random access memory modules of the memory module 200.

Example 40 may include the subject matter of one of the examples 22 to 39, wherein the means for communicating 12 is configured for transmitting the plurality of instruction signals to a registering clock driver of the memory module 200 and for receiving the loopback feedback signal from the registering clock driver of the memory module 200.

Example 41 relates to a host controller 100 for a memory module 200, the host controller 100 including the host controller device 10 according to one of the examples 22 to 40.

Example 42 relates to a computer system 1000 including the host controller 100 according to example 41.

Example 43 relates to a method for determining information related to a time shift for transmitting instructions on a command and address bus. The method includes transmitting 110 a plurality of instruction signals to the memory module 200 via the command and address bus. The method further includes receiving 120 a loopback feedback signal from the memory module 200, wherein the loopback feedback signal includes a looped-back composite version of the plurality of instruction signals. The method further includes determining 130 the information related to the time shift for transmitting instructions on the command and address bus based on the loopback feedback signal.

Example 44 may include the subject matter of example 34, wherein the method further includes determining information related to a setup and/or hold time of the plurality of instruction signals based on the loopback feedback signal, and wherein the information related to the time shift for transmitting instructions on the command and address bus is determined based on the information related to the setup and/or hold time of the plurality of instruction signals.

Example 45 may include the subject matter of one of the examples 43 or 44, wherein the loopback feedback signal includes a looped-back XOR-ed version of the plurality of instruction signals.

Example 46 may include the subject matter of one of the examples 43 to 45, wherein the loopback feedback signal received is sampled asynchronously.

Example 47 may include the subject matter of one of the examples 43 to 46, wherein a sequence of signal state vectors is transmitted within the plurality of instruction signals, wherein the loopback feedback signal includes a looped-back composite version for each signal state vector of the sequence of signal state vectors.

Example 48 may include the subject matter of example 47, wherein the sequence of signal state vectors is determined by choosing a signal state vector from a first plurality of signal state vectors in a first transmission state and by choosing a signal state vector from a second plurality of signal state vectors in a second transmission state, and wherein the method includes alternating between the first transmission state and the second transmission state based on a predefined transmission schedule.

Example 49 may include the subject matter of example 48, wherein the predefined transmission schedule specifies, that the first transmission state lasts a single clock cycle, and that the second transmission state lasts at least three clock cycles.

Example 50 may include the subject matter of one of the examples 48 or 49, wherein an instruction signal of the plurality of instruction signals is related to a chip select instruction of the memory module 200, wherein at least a subset of signal state vectors of the first plurality of signal state vectors assert the instruction signal of the plurality of instruction signals related to the chip select instruction.

Example 51 may include the subject matter of one of the examples 48 to 50, wherein the method includes obtaining the signal vectors of the first plurality of signal vectors and the signal vectors of the second plurality of signal vectors are from at least one buffer structure 16.

Example 52 may include the subject matter of example 51, wherein the at least one buffer structure is a command address data buffer 16 of a host controller.

Example 53 may include the subject matter of one of the examples 47 to 52, wherein the method includes comparing the looped-back composite version for each signal state vector of the sequence of signal state vectors to an expected result for each signal state vector of the sequence of signal state vectors, wherein the information related to the time shift for transmitting instructions on the command and address bus is determined based on the comparison of the looped-back composite version for each signal state vector of the sequence of signal state vectors and the expected result for each signal state vector of the sequence of signal state vectors.

Example 54 may include the subject matter of example 53, wherein the method includes counting the number of successful comparisons or the number of unsuccessful comparisons to determine the information related to the time shift for transmitting instructions on the command and address bus.

Example 55 may include the subject matter of one of the examples 43 to 54, wherein the method includes controlling a time shift of instructions transmitted via the command and address bus relative to a clock signal based on the information related to the time shift for transmitting instructions on the command and address bus.

Example 56 may include the subject matter of example 55, wherein the command and address bus includes a plurality of signal lines, wherein the method includes controlling the time shift of instructions transmitted via the command and address bus relative to a clock signal individually for the plurality of signal lines.

Example 57 may include the subject matter of one of the examples 43 to 56, wherein the command and address bus includes a plurality of signal lines, wherein the method includes determining the information related to the time shift for transmitting instructions on the command and address bus individually for the plurality of signal lines.

Example 58 may include the subject matter of one of the examples 43 to 57, wherein the plurality of instruction signals is transmitted to the memory module 200 using a double-pumped signal transmission.

Example 59 may include the subject matter of one of the examples 43 to 58, wherein the memory module 200 is a dual inline memory module 200.

Example 60 may include the subject matter of one of the examples 43 to 59, wherein the method includes transmitting the plurality of instruction signals to one or more dynamic random access memory modules of the memory module 200 and receiving the loopback feedback signal from the one or more dynamic random access memory modules of the memory module 200.

Example 61 may include the subject matter of one of the examples 43 to 60, wherein the method includes transmitting the plurality of instruction signals to a registering clock driver of the memory module 200 and to receiving the loopback feedback signal from the registering clock driver of the memory module 200.

Example 62 relates to a machine-readable storage medium including program code, when executed, to cause a machine to perform the method of one of the examples 43 to 61.

Example 63 relates to a computer program having a program code for performing the method of at least one of the examples 43 to 61, when the computer program is executed on a computer, a processor, or a programmable hardware component.

Example 64 relates to a machine-readable storage including machine-readable instructions, when executed, to implement a method or realize an apparatus as claimed in any pending example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A host controller apparatus for determining information related to a time shift for transmitting instructions on a command and address bus, the host controller apparatus comprising
   an interface for transmitting a plurality of instruction signals to a memory module via the command and address bus and for receiving a loopback feedback signal from the memory module; and
   a control module configured to:
   transmit the plurality of instruction signals to the memory module via the command and address bus, receive the loopback feedback signal from the memory module, wherein the loopback feedback signal comprises a looped-back composite version of the plurality of instruction signals, and determine the information related to the time shift for transmitting instructions on the command and address bus based on the loopback feedback signal.

2. The host controller apparatus according to claim 1, wherein the control module is configured to determine information related to a setup and/or hold time of the plurality of instruction signals based on the loopback feedback signal, and to determine the information related to the time shift for transmitting instructions on the command and address bus based on the information related to the setup and/or hold time of the plurality of instruction signals.

3. The host controller apparatus according to claim 1, wherein the loopback feedback signal comprises a looped-back XOR-ed version of the plurality of instruction signals.

4. The host controller apparatus according to claim 1, wherein the control module is configured to sample the loopback feedback signal received via the interface asynchronously.

5. The host controller apparatus according to claim 1, wherein the control module is configured to transmit a sequence of signal state vectors within the plurality of instruction signals, wherein the loopback feedback signal comprises a looped-back composite version for each signal state vector of the sequence of signal state vectors.

6. The host controller apparatus according to claim 5, wherein the control module is configured to determine the sequence of signal state vectors by choosing a signal state vector from a first plurality of signal state vectors in a first transmission state and by choosing a signal state vector from a second plurality of signal state vectors in a second transmission state, and wherein the control module is configured to alternate between the first transmission state and the second transmission state based on a pre-defined transmission schedule.

7. The host controller apparatus according to claim 6, wherein the pre-defined transmission schedule specifies, that the first transmission state lasts a single clock cycle, and that the second transmission state lasts at least three clock cycles.

8. The host controller apparatus according to claim 6, wherein an instruction signal of the plurality of instruction signals is related to a chip select instruction of the memory module, wherein at least a subset of signal state vectors of the first plurality of signal state vectors assert the instruction signal of the plurality of instruction signals related to the chip select instruction.

9. The host controller apparatus according to claim 6, wherein the control module is configured to obtain signal vectors of the first plurality of signal vectors and signal vectors of the second plurality of signal vectors from at least one buffer structure.

10. The host controller apparatus according to claim 5, wherein the control module is configured to compare the looped-back composite version for each signal state vector of the sequence of signal state vectors to an expected result for each signal state vector of the sequence of signal state vectors, wherein the control module is configured to determine the information related to the time shift for transmitting instructions on the command and address bus based on the comparison of the looped-back composite version for each signal state vector of the sequence of signal state vectors and the expected result for each signal state vector of the sequence of signal state vectors.

11. The host controller apparatus according to claim 10, wherein the control module is configured to count the number of successful comparisons or the number of unsuccessful comparisons to determine the information related to the time shift for transmitting instructions on the command and address bus.

12. The host controller apparatus according to claim 1, wherein the control module is configured to control a time shift of instructions transmitted via the command and address bus relative to a clock signal based on the information related to the time shift for transmitting instructions on the command and address bus.

13. The host controller apparatus according to claim 12, wherein the command and address bus comprises a plurality of signal lines, wherein the control module is configured to control the time shift of instructions transmitted via the command and address bus relative to a clock signal individually for the plurality of signal lines.

14. The host controller apparatus according to claim 1, wherein the command and address bus comprises a plurality of signal lines, wherein the control module is configured to determine the information related to the time shift for transmitting instructions on the command and address bus individually for the plurality of signal lines.

15. The host controller apparatus according to claim 1, wherein the control module is configured to transmit the plurality of instruction signals to the memory module using a double-pumped signal transmission.

16. The host controller apparatus according to claim 1, wherein the memory module is a dual in-line memory module.

17. The host controller apparatus according to claim 1, wherein the interface is configured to transmit the plurality of instruction signals to one or more dynamic random access memory modules of the memory module and to receive the loopback feedback signal from the one or more dynamic random access memory modules of the memory module.

18. The host controller apparatus according to claim 1, wherein the interface is configured to transmit the plurality of instruction signals to a registering clock driver of the memory module and to receive the loopback feedback signal from the registering clock driver of the memory module.

19. A host controller for a memory module, the host controller comprising the host controller apparatus according to claim 1.

20. A method for determining information related to a time shift for transmitting instructions on a command and address bus, the method comprising
transmitting a plurality of instruction signals to the memory module via the command and address bus,
receiving a loopback feedback signal from the memory module, wherein the loopback feedback signal comprises a looped-back composite version of the plurality of instruction signals, and
determining the information related to the time shift for transmitting instructions on the command and address bus based on the loopback feedback signal.

* * * * *